(12) United States Patent
Han et al.

(10) Patent No.: US 11,943,927 B2
(45) Date of Patent: Mar. 26, 2024

(54) SEMICONDUCTOR MEMORY DEVICE

(71) Applicant: SK hynix Inc., Icheon-si (KR)

(72) Inventors: Jae Hyun Han, Icheon-si (KR); Won Tae Koo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 195 days.

(21) Appl. No.: 17/405,759

(22) Filed: Aug. 18, 2021

(65) Prior Publication Data

US 2022/0285390 A1 Sep. 8, 2022

(30) Foreign Application Priority Data

Mar. 4, 2021 (KR) .................. 10-2021-0028914

(51) Int. Cl.
*H10B 43/27* (2023.01)
*H01L 29/423* (2006.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 43/27; H10B 41/27; H10B 41/48; H10B 41/46; H10B 41/35; H10B 43/35; H10B 43/00; H01L 21/8229; H01L 21/8239; H01L 27/222; H01L 27/24; H01L 29/685; H01L 29/792; H01L 29/8615; H01L 45/04; H01L 2027/11838; H01L 2924/13089; H01L 29/42324; H01L 29/4234; H01L 29/788
See application file for complete search history.

(56) References Cited

U.S. PATENT DOCUMENTS

| | | | |
|---|---|---|---|
| 10,777,576 B1 | 9/2020 | Kim et al. | |
| 11,532,757 B2 * | 12/2022 | Calka | H10B 43/27 |
| 2010/0314679 A1 * | 12/2010 | Lee | H01L 29/513 |
| | | | 257/324 |
| 2019/0139983 A1 * | 5/2019 | Lee | H10B 41/27 |
| 2019/0280005 A1 * | 9/2019 | Bin | H01L 21/76837 |

FOREIGN PATENT DOCUMENTS

KR 1020200035469 A 4/2020

OTHER PUBLICATIONS

Li WJ, Liu J, Sun ZH, Liu TF, Lü J, Gao SY, He C, Cao R, Luo JH. Integration of metal-organic frameworks into an electrochemical dielectric thin film for electronic applications. Nat Commun. Jun. 10, 2016;7:11830. doi: 10.1038/ncomms11830. PMID: 27282348; PMCID: PMC4906389. (Year: 2016).*

Eslava et al. "Metal-Organic Framework ZIF-8 Films As Low-κ Dielectrics in Microelectronics", Salvador Eslava, Liping Zhang, Santiago Esconjauregui, Junwei Yang, Kris Vanstreels, Mikhail R. Baklanov, and Eduardo Saiz Chemistry of Materials 2013 25 (1), 27-33 DOI: 10.1021/cm302610z. (Year: 2013).*

* cited by examiner

*Primary Examiner* — David Vu
(74) *Attorney, Agent, or Firm* — William Park & Associates Ltd.

(57) ABSTRACT

A semiconductor memory device includes a tunnel insulating layer, a data storage layer, and a blocking insulating layer that are sequentially disposed. The tunnel insulating layer includes Metal Organic Frameworks (MOF) having a lower dielectric constant than a dielectric constant of the blocking insulating layer.

6 Claims, 11 Drawing Sheets

SEMICONDUCTOR MEMORY DEVICE

CROSS-REFERENCE TO RELATED APPLICATION

The present application claims priority under 35 U.S.C, § 119(a) to Korean patent application number 10-2021-0028914, filed on Mar. 4, 2021, in the Korean Intellectual Property Office, the entire disclosure of which is incorporated herein by reference.

BACKGROUND

1. Technical Field

Various embodiments of the present disclosure generally relate to a semiconductor memory device, and more particularly, to a nonvolatile semiconductor memory device.

2. Related Art

A nonvolatile memory device may retain data even when a supply of power is interrupted, A flash memory device is a type of nonvolatile memory device, and it is used for various portable electronic devices. A memory cell of the flash memory may include a tunnel insulating layer, a data storage layer, and a blocking insulating layer.

SUMMARY

In accordance with an embodiment of the present disclosure is a semiconductor memory device including a stacked body including interlayer insulating layers and word lines that are alternately stacked, a channel layer passing through the stacked body, a blocking insulating layer between each of the word lines and the channel layer, a data storage layer between the blocking insulating layer and the channel layer, and a tunnel insulating layer between the channel layer and the data storage layer. The tunnel insulating layer includes Metal Organic Frameworks (MOF) having a lower dielectric constant than a dielectric constant of the blocking insulating layer.

In accordance with an embodiment of the present disclosure is a semiconductor memory device including a gate electrode over a semiconductor substrate, a blocking insulating layer between the semiconductor substrate and the gate electrode, a data storage layer between the semiconductor substrate and the blocking insulating layer, and a tunnel insulating layer between the semiconductor substrate and the data storage layer. The tunnel insulating layer includes Metal Organic Frameworks (MOF) having a lower dielectric constant than a dielectric constant of the blocking insulating layer.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

Various embodiments of the present disclosure are directed to a semiconductor memory device capable of decreasing an operating voltage and improving operating speed.

Figure 1:
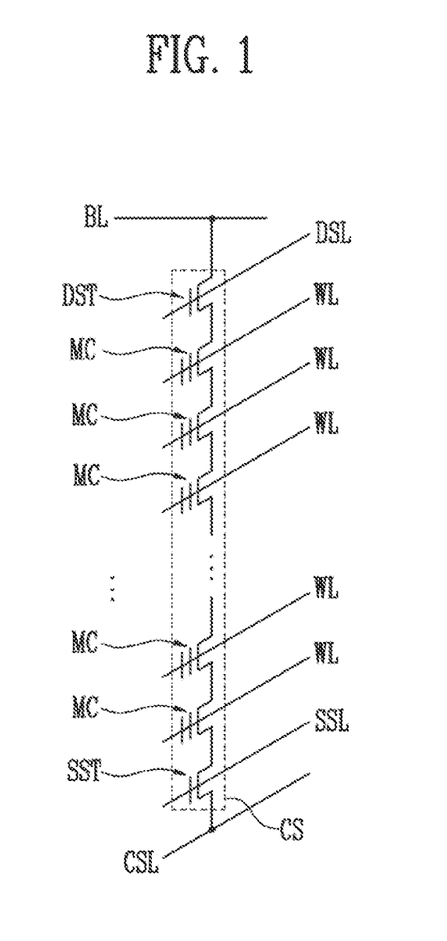
FIG. 1 is a schematic circuit diagram illustrating a semiconductor memory device according to an embodiment of the present disclosure.

FIG. 1 is a schematic circuit diagram illustrating a semiconductor memory device according to an embodiment of the present disclosure.

Referring to FIG. 1, the semiconductor memory device may be a three-dimensional (3D) nonvolatile memory device or a two-dimensional (2D) nonvolatile memory device, According to an embodiment, the nonvolatile memory device may be a NAND flash memory device.

The NAND flash memory device may include a memory cell string CS coupled to a bit line BL and a common source line CSL. The drawing illustrates a single memory cell string CS, but a plurality of memory cell strings may be coupled in parallel between the bit line BL and the common source line CSL.

The memory cell string CS may include a source select transistor SST, a plurality of memory cells MC, and a drain select transistor DST disposed between the common source line CSL and the bit line BL.

The source select transistor SST may control the electrical coupling between the plurality of memory cells MC and the common source line CSL. A single source select transistor SST may be disposed between the common source line CSL and the plurality of memory cells MC, Although not illustrated in the drawing, two or more source select transistors coupled in series to each other may be disposed between the common source line CSL and the plurality of memory cells MC. The source select transistor SST may be coupled to a source select line SSL. The operation of the source select transistor SST may be controlled by a source gate signal applied to the source select line SSL.

The plurality of memory cells MC may be disposed between the source select transistor SST and the drain select transistor DST. The memory cells MC between the source select transistor SST and the drain select transistor DST may be coupled in series to each other. The memory cells MC may be coupled to respective word lines WL. The operation of the memory cells MC may be controlled by cell gate signals applied to the word lines WL.

The drain select transistor DST may control the electrical coupling between the plurality of memory cells MC and the bit line BL. The drain select transistor DST may be coupled to a drain select line DSL. The operation of the drain select transistor DST may be controlled by a drain gate signal applied to the drain select line DSL.

Each of the memory cells MC may store single-bit data or multi-bit data,

FIG. 2A, FIG. 2B, FIG. 2C, FIG. 2D, FIG. 2E, and FIG. 2F are views illustrating various embodiments for a semiconductor memory device.

Figure 2A:
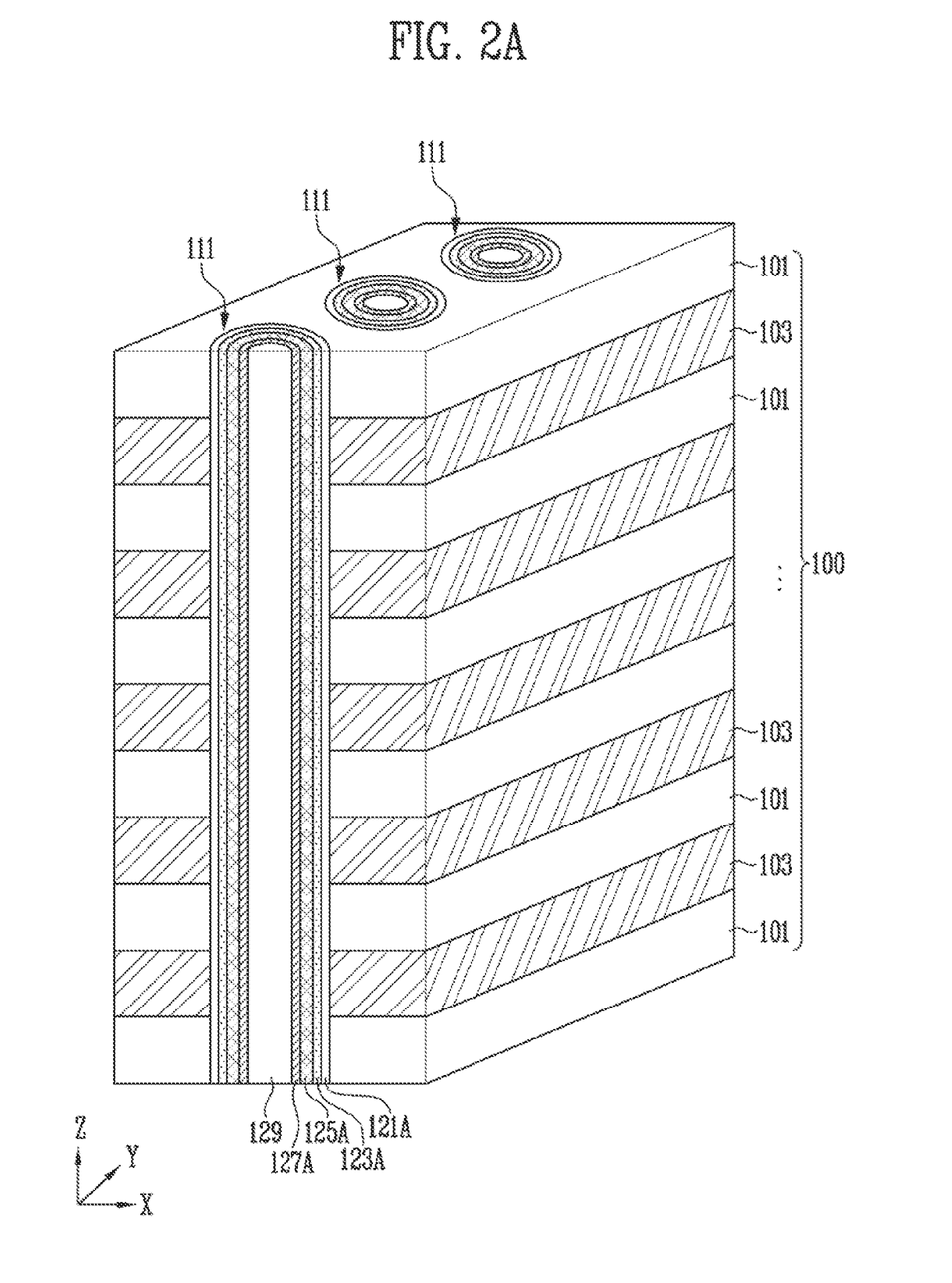
FIGS. 2A, 2B, 2C, 2D, 2E, and 2F are views illustrating various embodiments for a semiconductor memory device.
Figure 2B:
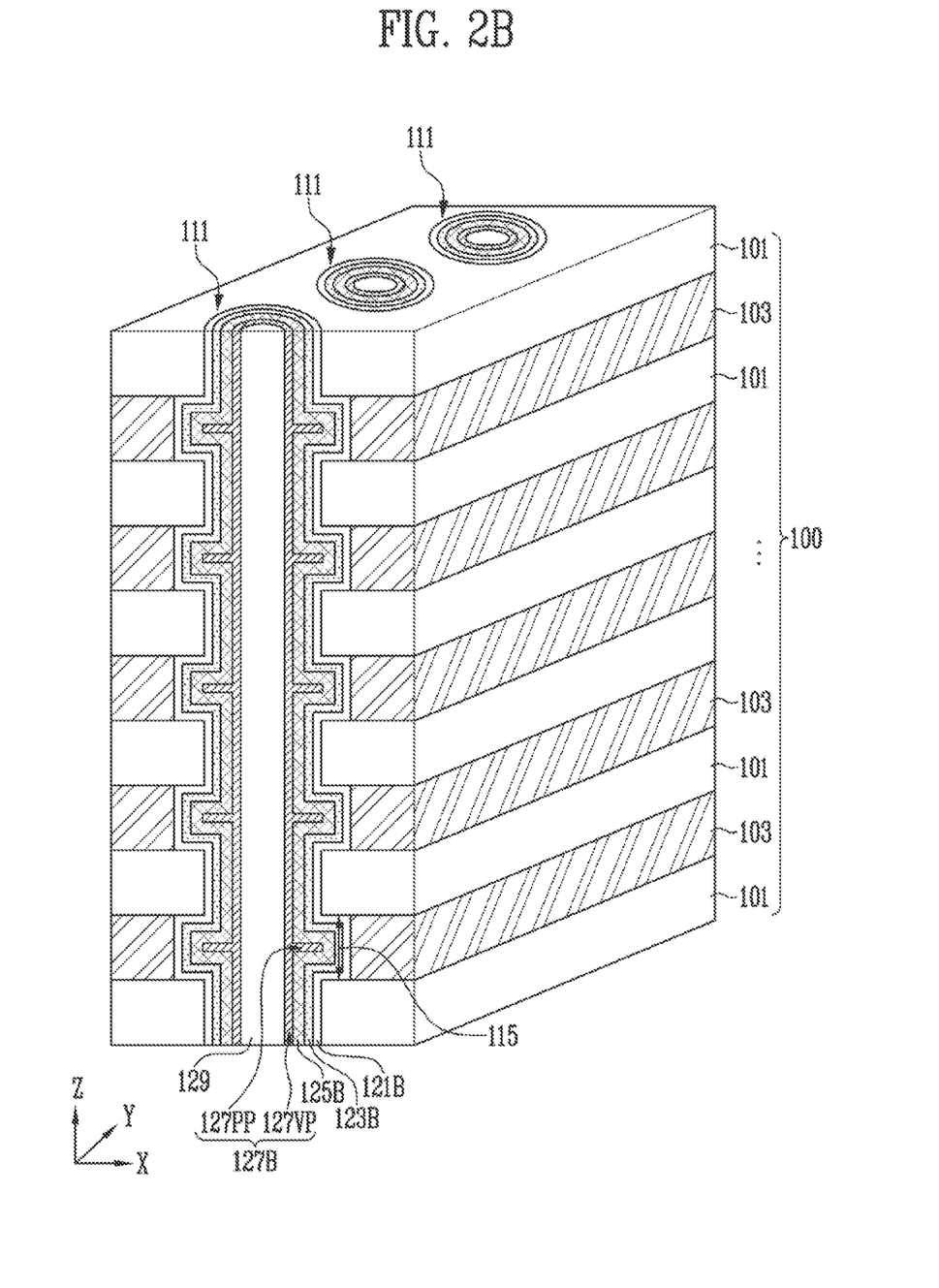
Figure 2C:
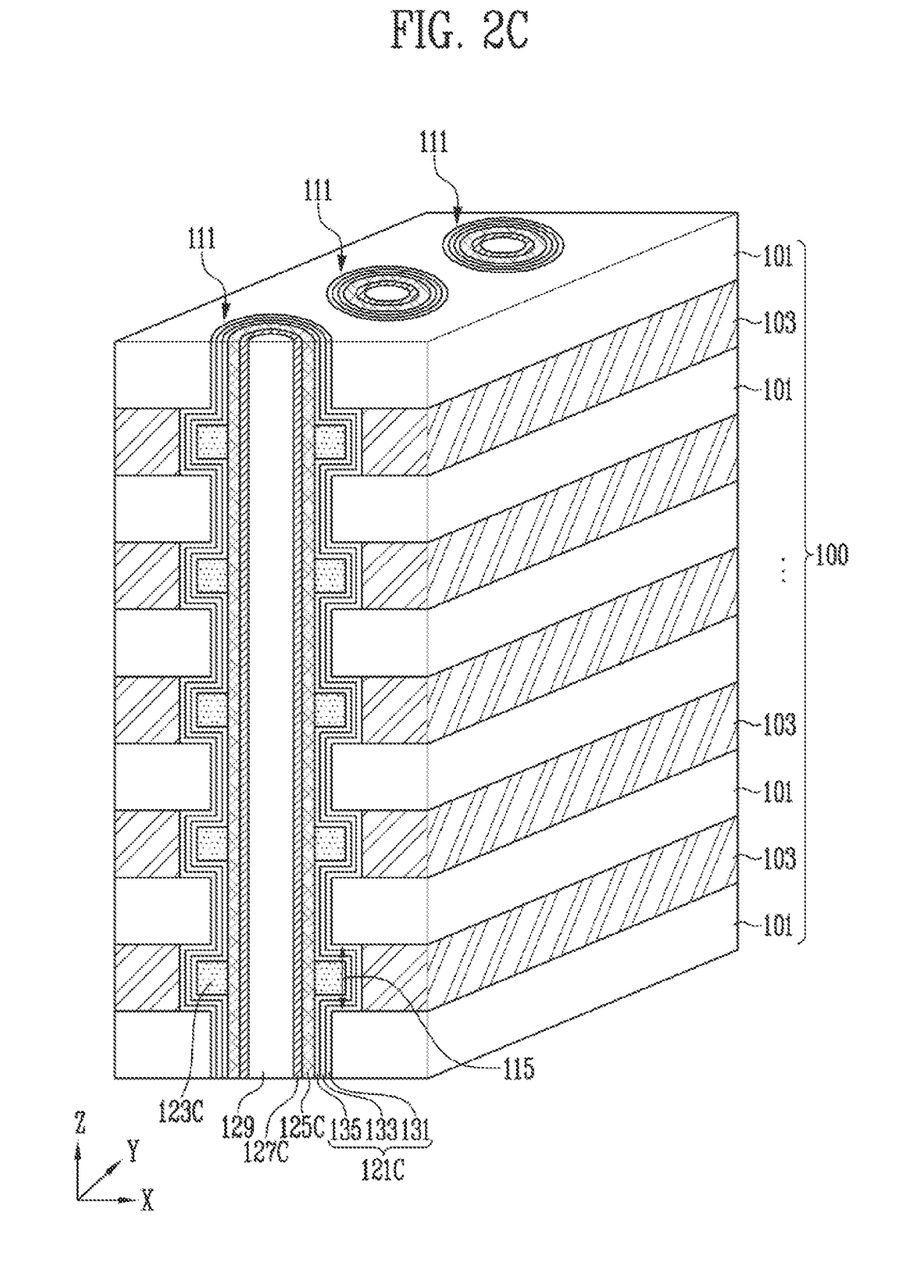

FIG. 2A, FIG. 2B, and FIG. 2C are perspective views illustrating various embodiments for a 3D NAND flash memory device. Referring to FIG. 2A, FIG. 2B, and FIG. 2C, the semiconductor memory device may include a stacked body 100, a channel layer 127A, 127B, or 127C, a tunnel insulating layer 125A, 125B, or 125C, a data storage layer 123A, 123B, or 123C, and a blocking insulating layer 121A, 121B, or 121C.

The stacked body 100 may include interlayer insulating layers 101 and word lines 103. Each of the interlayer insulating layers 101 and the word lines 103 may be parallel to an X-Y plane. The interlayer insulating layers 101 and the word lines 103 may be stacked in a Z-axis direction perpendicular to the X-Y plane. The interlayer insulating layers 101 may be disposed alternately with the word lines 103.

The word lines 103 may be insulated from each other by the interlayer insulating layers 101. The word lines 103 may be used as the gate electrodes of the memory cells MC described with reference to FIG. 1, The word lines 103 may include at least one of a doped semiconductor, metal, a metal nitride, and a metal silicide. The interlayer insulating layers 101 may include a silicon oxide layer.

The stacked body 100 may be penetrated by a hole 111 extending in the Z-axis direction. The sidewalls of the interlayer insulating layers 101 may be defined along the sidewall of the hole 111.

According to the embodiment illustrated in FIG. 2A, the sidewalls of the word lines 103 may be defined along the sidewall of the hole 111.

According to the embodiments illustrated in FIG. 2B and FIG. 2C, each of the word lines 103 may have a sidewall that is disposed farther from the central axis of the hole 111 than the interlayer insulating layers 101. Accordingly, a recess area 115 may be defined between the interlayer insulting layers 101 that are adjacent to each other in the Z-axis direction.

The channel layer 127A, 127B, or 127C may include a semiconductor, such as silicon or the like. The channel layer 127A, 127B, or 127C may extend in the Z-axis direction. The channel layer 127A, 1278, or 127C may form the channel area of the memory cell string CS illustrated in FIG. 1. The channel layer 127A, 1278, or 127C may be enclosed by the interlayer insulating layers 101 and the word lines 103.

The blocking insulating layer 121A, 121B, or 121C may be interposed between the channel layer 127A, 127B, or 127C and the stacked body 100. The blocking insulating layer 121A, 121B, or 121C may include a single layer or a plurality of layers.

The data storage layer 123A, 123B, or 123C may be interposed between the blocking insulating layer 121A, 1213, or 121C and the channel layer 127A, 127B, or 127C. The data storage layer 123A, 123B, or 123C may include a charge trap layer or a floating gate layer.

The tunnel insulating layer 125A, 1253, or 125C may be interposed between the data storage layer 123A, 123B, or 123C and the channel layer 127A, 127B, or 127C. The tunnel insulating layer 125A, 1253, or 125C may include Metal Organic Frameworks (MOF).

The semiconductor memory device may further include a core insulating layer 129 that fills the central area of the hole 111. The channel layer 127A, 127B, or 127C may enclose the sidewall of the core insulating layer 129. Unlike what is illustrated in FIGS. 2A to 2C, the core insulating layer 129 may be omitted, and the channel layer may extend to fill the central area of the hole 111.

The channel layer 127A, 1273, or 127C, the tunnel insulating layer 125A, 125B, or 125C, the data storage layer 123A, 123B, or 123C, and the blocking insulating layer 121A, 121B, or 121C may be formed in various structures.

Referring to FIG. 2A, the blocking insulating layer 121A, the data storage layer 123A, and the tunnel insulating layer 125A may extend in the Z-axis direction along the sidewall of the channel layer 127A. Each of the blocking insulating layer 121A, the data storage layer 123A, and the tunnel insulating layer 125A may be disposed between each of the word lines 103 and the channel layer 127A, and may extend into space between each of the interlayer insulating layers 101 and the channel layer 127A.

The blocking insulating layer 121A may include a silicon oxide layer, but embodiments of the present disclosure are not limited thereto. In an embodiment, the blocking insulating layer 121A may include a silicon oxide layer and a metal oxide layer between the silicon oxide layer and the stacked body 100. The metal oxide layer may include an oxide having higher dielectric constant than that of the silicon oxide layer. In an embodiment, the metal oxide layer may include an aluminum oxide layer.

The data storage layer 123A may include a charge trap layer extending in the Z-axis direction along the sidewall of the channel layer 127k In an embodiment, the charge trap layer may include a silicon nitride layer.

Referring to FIG. 2B, the channel layer 127B may include a vertical portion 127VP extending in the Z-axis direction and a protrusion 127PP protruding from the vertical portion 127VP towards each of the word lines 103.

Each of the blocking insulating layer 121B, the data storage layer 123B, and the tunnel insulating layer 125B may extend into the recess area 115. Each of the blocking insulating layer 121B, the data storage layer 123B, and the tunnel insulating layer 125B may be conformally formed along the recess area 115, and may have a bending structure. Each of the blocking insulating layer 121B, the data storage layer 123B, and the tunnel insulating layer 125B may enclose the protrusion 127PP of the channel layer 127B.

The blocking insulating layer 121B may include the same material as the blocking insulating layer 121A described with reference to FIG. 2A, and the data storage layer 123B may include the same material as the data storage layer 123A described with reference to FIG. 2A.

The charge trap layer as the data storage layer 123B is formed in a bending structure, whereby a phenomenon in which charges stored in the charge trap layer move in the Z-axis direction may be reduced. Accordingly, the reliability of the operation of the semiconductor memory device may be improved.

Although not illustrated in FIG. 2B, the protrusion 127PP of the channel layer 127B may be omitted, and the tunnel insulating layer 125B may be extended to fill the central area of the recess area 115, in an embodiment.

Referring to FIG. 2C, the data storage layers 123C may be spaced apart from each other in the Z-axis direction. Each of the data storage layers 123C may be locally formed between the interlayer insulating layers 101 that are adjacent to each other in the Z-axis direction. The data storage layers 123C are separated from each other in the Z-axis direction, whereby a phenomenon in which charges stored in the data storage layers 123C move in the Z-axis direction may be prevented. Each of the data storage layers 123C may include a charge trap layer or a floating gate layer. In an embodiment, the charge trap layer may include a silicon nitride layer. In an embodiment, the floating gate layer may include silicon.

The blocking insulating layer 121C may include a column portion between each of the interlayer insulating layers 101 and the tunnel insulating layer 125 and a bending portion between each of the word lines 103 and each of the data storage layers 123C. The column portion of the blocking insulating layer 121C may come into direct contact with the tunnel insulating layer 125C, and the bending portion of the blocking insulating layer 121C may be conformally formed along the recess area 115. The blocking insulating layer 121C may include a first oxide layer 131, a nitride layer 133, and a second oxide layer 135, but embodiments of the present disclosure are not limited thereto. In an embodiment, the blocking insulating layer 121C may include the same material as the blocking insulating layer 121A described with reference to FIG. 2A.

In the above description, the first oxide layer 131 may be conformally formed along the sidewall of the hole 111 and the recess area 115. The second oxide layer 135 may be interposed between the first oxide layer 131 and the tunnel insulating layer 125C. The nitride layer 133 may be interposed between the first oxide layer 131 and the second oxide layer 135. The first oxide layer 131 and the second oxide layer 135 may include silicon dioxide.

Figure 2D:
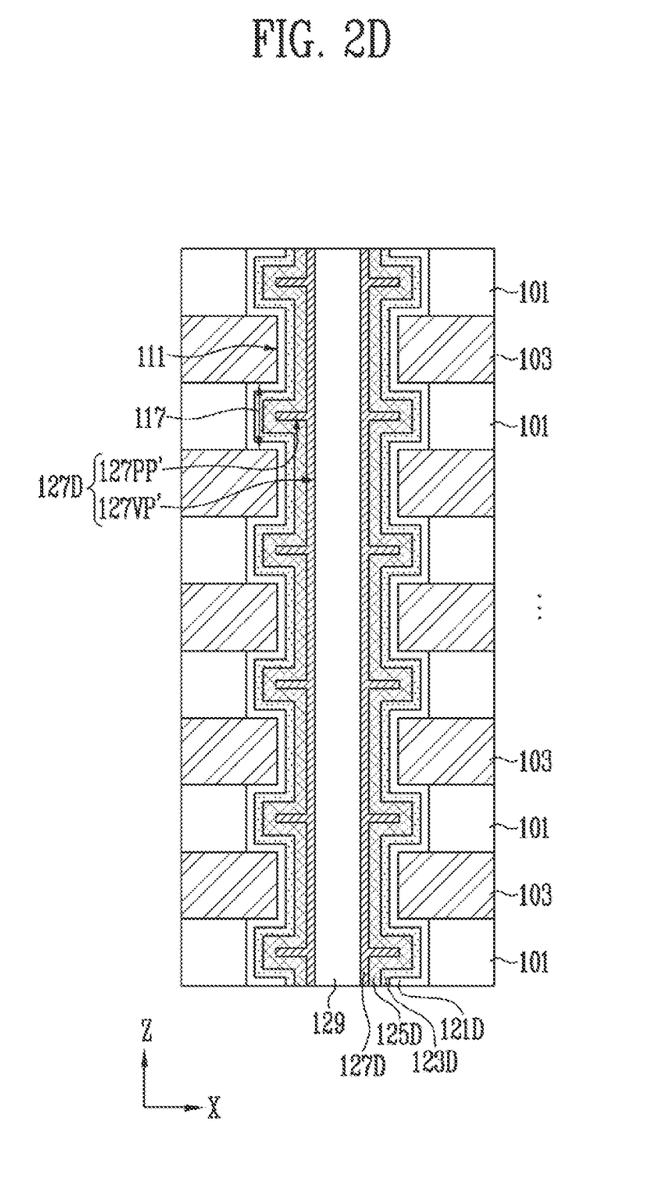
Figure 2E:
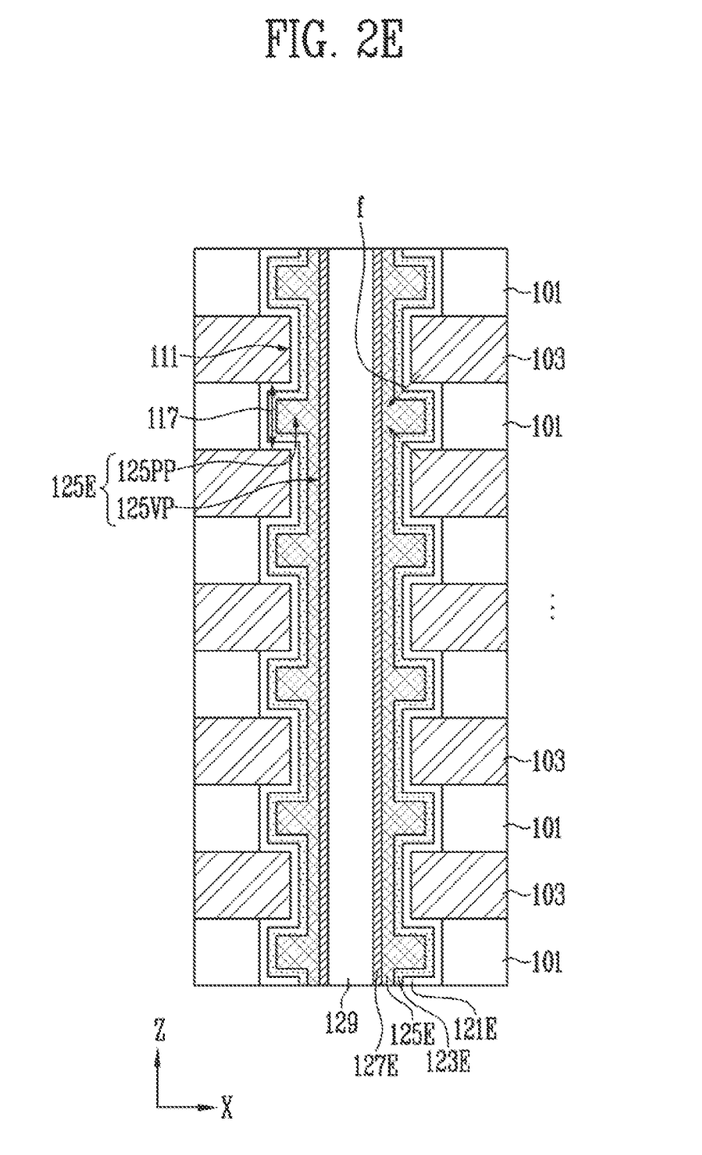

FIG. 2D and FIG. 2E are sectional views illustrating various embodiments for a 3D NAND flash memory device. Hereinafter, descriptions redundant with those describing FIGS. 2A to 2C will be omitted.

Referring to FIG. 2D and FIG. 2E, a semiconductor memory device may include a stacked body 100, a channel layer 127D or 127E, a tunnel insulating layer 125D or 125E, a data storage layer 123D or 123E, and a blocking insulating layer 121D or 121E.

The interlayer insulating layers 101 and word lines 103 of the stacked body 100 may be penetrated by a hole 111 extending in the Z-axis direction. The sidewalls of the word lines 103 may be defined along the sidewall of the hole 111. Each of the interlayer insulating layers 101 may have a sidewall that is disposed farther from the central axis of the hole 111 than the word lines 103. Accordingly, a recess area 117 may be defined between the word lines 103 adjacent to each other in the Z-axis direction.

In an embodiment, the central area of the hole 111 may be filled with a core insulating layer 129. The channel layer 127D or 127E may enclose the core insulating layer 129.

The blocking insulating layer 121D or 121E between the stacked body 100 and the channel layer 127D or 127E may include a single layer or a plurality of layers. The data storage layer 123D or 123E between the channel layer 127D or 127E and the blocking insulating layer 121D or 121E may include a charge trap layer. The tunnel insulating layer 125D or 125E between the channel layer 127D or 127E and the data storage layer 123D or 123E may include Metal Organic Frameworks (MOF).

Each of the blocking insulating layer 121D or 121E and the data storage layer 123D or 123E may include portions parallel to the sidewalls of the word lines 103. Each of the blocking insulating layer 121D or 121E and the data storage layer 123D or 123E may have a bending portion conformally formed along the recess area 117. The charge trap layer as the data storage layer 123D or 123E is formed in a bending structure, whereby a phenomenon in which charges stored in the charge trap layer move in the Z-axis direction may be reduced. According to the embodiment illustrated in FIG. 2D and FIG. 2E, the charge trap area may include an area enclosed by the word line 103 in the data storage layer 123D or 123E, and may extend to the area enclosing the edge of each of the word lines 103, Accordingly, the data storage area may be enlarged.

Referring to FIG. 2D, the tunnel insulating layer 125D may extend to be parallel to the data storage layer 123D. The tunnel insulating layer 125D may have portions parallel to the sidewalls of the word lines 103 and a bending portion conformally formed along the recess area 117.

The channel layer 127D may include a vertical portion 127VP' extending in the Z-axis direction and a protrusion 127PP' protruding from the vertical portion 127VP' towards each of the interlayer insulating layers 101. The tunnel insulating layer 125D may enclose the protrusion 127PP' of the channel layer 127D.

Referring to FIG. 2E, the tunnel insulating layer 125E may include a vertical portion 125VP extending in the Z-axis direction and a protrusion 125PP protruding from the vertical portion 125VP towards each of the interlayer insulating layers 101. The protrusion 125PP of the tunnel insulating layer 125E may fill the central area of the recess area 117.

The channel layer 127E may extend in the Z-axis direction so as to be parallel to the vertical portion 125VP of the tunnel insulating layer 125E.

Referring to FIG. 2D and FIG. 2E, because a fringing field f generated by a voltage applied to the word lines 103 can be shielded through the tunnel insulating layer 125D or 125E formed in the recess area 117, interference between memory cells adjacent to each other in the Z-axis direction may be reduced. Accordingly, variation in the threshold voltage of the memory cell may be reduced, and operation disturbance, such as program disturbance or the like, may be reduced. As a result, the reliability of the operation of the semiconductor memory device may be improved.

Figure 2F:
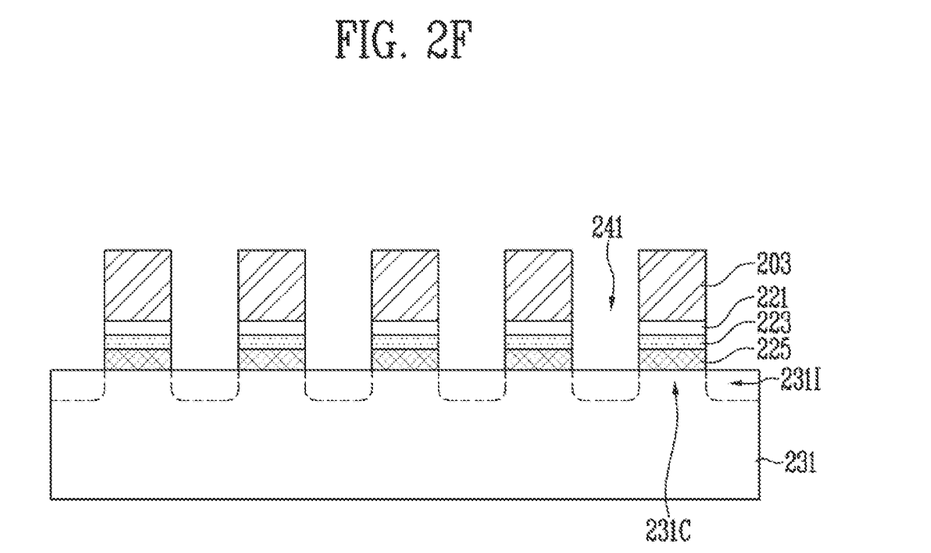

FIG. 2F is a sectional view illustrating an embodiment for a 2D NAND flash memory device.

Referring to FIG. 2F, a semiconductor memory device may include a semiconductor substrate 231, gate electrodes 203, a tunnel insulating layer 225, a data storage layer 223, and a blocking insulating layer 221.

The semiconductor substrate 231 may include an active area. Although not illustrated in the drawing, the active area may be segmented by an isolation layer. FIG. 2F illustrates a section taken by cutting the active area of the semiconductor substrate 231.

The gate electrodes 203 may be disposed over the semiconductor substrate 231. The gate electrodes 203 may be spaced apart from each other by a trench 241 along the direction in which the active area extends. Although not illustrated in the drawing, the upper portion of each of the gate electrodes 203 extends in the direction intersecting with the active area, thereby forming a word line.

In the semiconductor substrate 231 on the opposite sides of the gate electrodes 203, impurity areas 231I may be disposed. A portion of the active area, overlapping each of the gate electrodes 203 and disposed between the impurity areas 231I, may be defined as a channel area 231C.

The tunnel insulating layer 225, the data storage layer 223, and the blocking insulating layer 221 may be sequentially stacked between each of the gate electrodes 203 and the semiconductor substrate 231.

The blocking insulating layer 221 may be interposed between each of the gate electrodes 203 and the semiconductor substrate 231.

The blocking insulating layer 221 may include the same material as the blocking insulating layer 121A described with reference to FIG. 2A, or may include a structure in which the first oxide layer 131, the nitride layer 133, and the second oxide layer 135 described with reference to FIG. 2C are stacked.

The data storage layer 223 may be interposed between the blocking insulating layer 221 and the semiconductor substrate 231. The data storage layer 223 may include a charge trap layer or a floating gate layer. The data storage layer 223 may be locally formed over the semiconductor substrate 231 between the impurity areas 231I, and may be spaced apart from another data storage layer 223. In other words, the data storage layers 223 adjacent to each other in the direction in which the active area of the semiconductor substrate 231 extends may be to separated from each other by the trench 241, However, embodiments of the present disclosure are not limited thereto. Although not illustrated in the drawing, the charge trap layer as the data storage layer 223 may continuously extend along the active area of the semiconductor substrate 231 and overlap the impurity areas 231I, in an embodiment.

The tunnel insulating layer 225 may be interposed between the data storage layer 223 and the semiconductor substrate 231. The tunnel insulating layer 225 may include Metal Organic Frameworks (MOF). In an embodiment, the tunnel insulating layer 225 may be penetrated by the trench 241, but embodiments of the present disclosure are not limited thereto, Although not illustrated in the drawing, the tunnel insulating layer 225 may continuously extend along the active area of the semiconductor substrate 231 and overlap the impurity areas 231I, in an embodiment.

As described above with reference to FIGS. 2A to 2E, the tunnel insulating layer according to an embodiment of the present disclosure may include Metal Organic Frameworks (MOF). The MOF are porous compounds formed of a chemical combination of metal ions and organic ligands or a chemical combination of a metal duster and organic ligands. The MOF are a material that is controllable to have dielectric constant less than that of a silicon dioxide ($SiO_2$). Because the MOF can be formed through Atomic Layer Deposition (ALD) having excellent step coverage, embodiments of the present disclosure may improve the thickness uniformity of the tunnel insulating layer. Because the dielectric constant to of the MOF may be controlled to be equal to or less than 2, tunneling of charges caused by a program voltage and an erase voltage may increase. Accordingly, embodiments of the present disclosure may improve the speed of a program operation and the speed of an erase operation. Because the dielectric constant of the tunnel insulating layer having MOF may be controlled to be low, the efficiency of shielding the fringing field, described with reference to FIG. 2D and FIG. 2E, may be improved.

Figure 3:
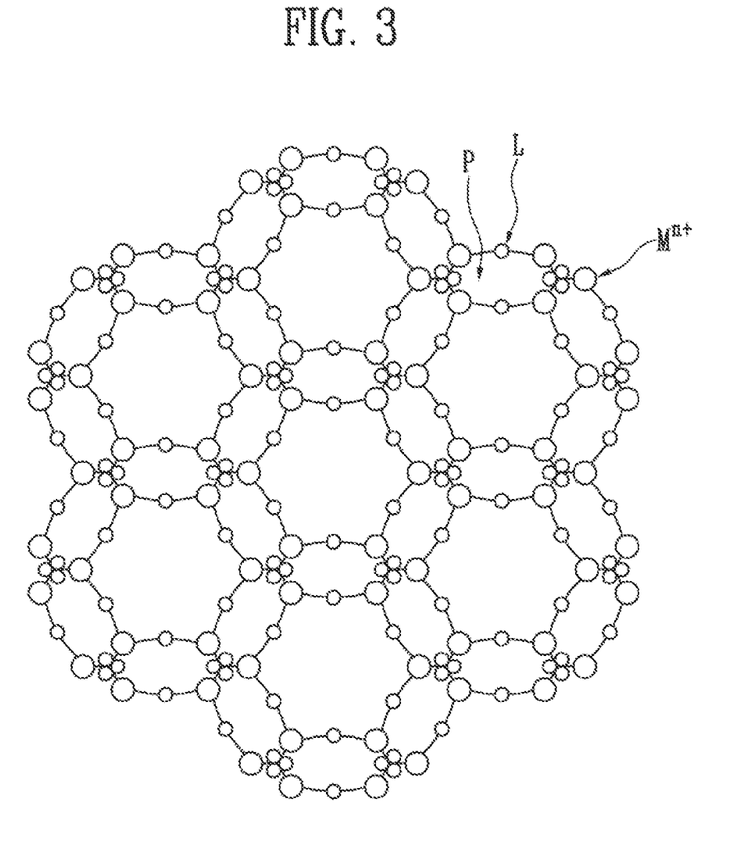
FIG. 3 is a view illustrating a tunnel insulating layer according to an embodiment of the present disclosure.

FIG. 3 is a view illustrating a tunnel insulating layer according to an embodiment of the present disclosure.

Referring to FIG. 3, the tunnel insulating layer is Metal Organic Frameworks (MOF) formed of metal centers $M^{n+}$ coordinated to organic ligands L, and may have pores P. When the MOF are provided, a coordination number, the length of the ligands L, a reaction environment for combining the metal centers $M^{n+}$ with the organic ligands L, and the like may be variously controlled. Accordingly, the size of the pores P may be variously controlled, and the dielectric constant of the MOF may be controlled to be a low value within a range from 1 to 2.

The metal centers $M^{n+}$ of the MOF may include $Zn^{2+}$, $Zr^{4+}$, $Al^{3+}$, and the like.

The organic ligands L of the MOF may include 2-methylimidazole, 2-aminoterephthalic acid, 1,3,5-benzenetricarboxylate, and the like.

The MOF may include MOF series, ZIF series, UIO series, SIM series, MIL series, HKUST series, and the like. For example, as the MOF series, MOF named MOF-1, MOF-177, or the like may be used as the tunnel insulating layer.

As metallic salts for forming MOF, $Zn_4O(CO_2)_6$, $Zn_3O(CO_2)_6$, $Cr_3O(CO_2)_6$, $In_3O(CO_2)_6$, $Ga_3O(CO_2)_6$, $Cu_2O(CO_2)_4$, $Zn_2O(CO_2)_4$; $Fe_2O(CO_2)_4$, $Mo_2O(CO_2)_4$, $Cr_2O(CO_2)_4$, $CO_2O(CO_2)_4$, $Ru_2O(CO_2)_4$, $Zr_6O_4(OH)_4$, $Zr_6O_4(CO_2)_{12}$, $Zr_6O_8(CO_2)_8$, $In(C_5HO_4N_2)_4$, $Na(OH)_2(SO_3)_3$, $Cu_2(CNS)_4$, $Zn(C_3H_3N_2)_4$, $Ni_4(C_3H_3N_2)_8$, $Zn_3O_3(CO_2)_3$, $Mg_3O_3(CO_2)_3$, $CO_3O_3(CO_2)_3$, $Ni_3O_3(CO_2)_3$, $Mn_3O_3(CO_2)_3$, $Fe_3O_3(CO_2)_3$, $Cu_3O_3(CO_2)_3$, $Al(OH)(CO_2)_2$, $VO(CO_2)_2$, $Zn(NO_3)_2$, $Zn(O_2CCH_3)$, $Co(NO_3)_2$, $Co(O_2CCH_3)$, and the like may be used.

As organic ligands for forming MOF, there are an oxalic acid, a fumaric acid, a terephthalic acid ($H_2BDC$), $H_2BDC$-Br, $H_2BDC$—OH, $H_2BDC$-$NO_2$, $H_2BDC$-$NH_2$, $H_4DOT$, $H_2BDC$—(Me)$_2$, $H_2BDC$—(Cl)$_2$, $H_2BDC$—(COOH)$_2$, $H_2BDC$—(OC$_3$H$_5$)$_2$, $H_2BDC$—(OC$_7$H$_7$)$_2$, $H_3BTC$, $H_3BTE$, $H_3BBC$, $H_4ATC$, $H_3THBTS$, $H_3ImDC$, $H_3BTP$, DTOA, $H_3BTB$, $H_3TATB$, $H_4ADB$, TIPA, ADP, $H_6BTETCA$, DCDPBN, BPP34C10DA, $Ir(H_2DPBPyDC)(PPy)_2^+$, $H_4DH9PhDC$, $H_4DH11PhDC$, $H_6TPBTM$, $H_6BTEI$, $H_6BTPI$, $H_6BHEI$, $H_6BTTI$, $H_6PTEI$, $H_6TTEI$, $H_6BNETPI$, $H_6BHEHPI$, HMeIM, and the like.

Figure 4:
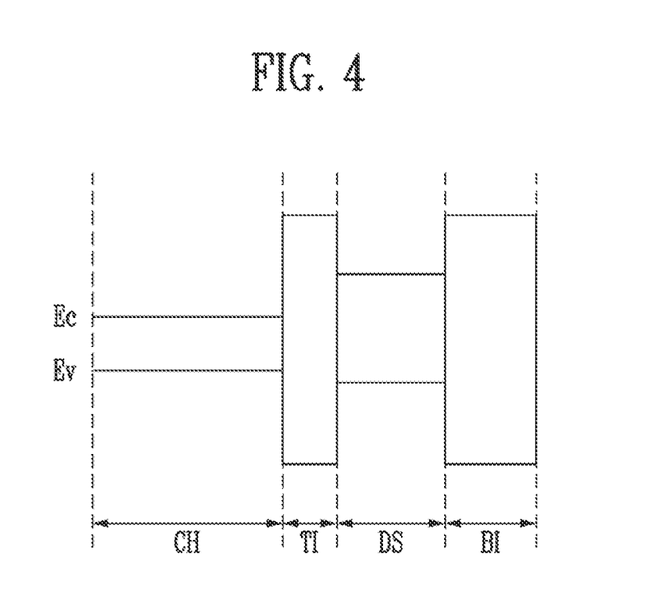
FIG. 4 is an energy band diagram of a memory cell according to an embodiment of the present disclosure in the state in which an electric field is not applied.

FIG. 4 illustrates an energy band diagram of a memory cell according to an embodiment of the present disclosure in the state in which an electric field is not applied.

Referring to FIG. 4, a channel area CH, a tunnel insulating layer TI, a data storage layer DS, and a blocking insulating layer BI may be sequentially disposed. The thickness of each of the channel area CH, the tunnel insulating layer TI, the data storage layer DS, and the blocking insulating layer BI may be changed depending on the material thereof.

The channel area CH may be defined as one of the channel layers illustrated in FIGS. 2A to 2E and the channel area of the semiconductor substrate illustrated in FIG. 2F. The tunnel insulating layer TI may be one of the tunnel insulating layers illustrated in FIGS. 2A to 2F. The data storage layer DS may be one of the data storage layers illustrated in FIGS. 2A to 2F. The blocking insulating layer BI may be one of the blocking insulating layers illustrated in FIGS. 2A to 2F.

The energy band gap of the tunnel insulating layer TI and the energy band gap of the blocking insulating layer BI may be greater than the energy band gap of the data storage layer DS. The energy band gap indicates the difference between the energy level Ev of a valence band and the energy level Ec of a conduction band.

The dielectric constant of the tunnel insulating layer TI formed of MOF may be controlled to be less than the dielectric constant of the blocking insulating layer BI. The blocking insulating layer BI may include at least one of silicon dioxide and a high dielectric material having higher dielectric constant than the silicon dioxide. The tunnel insulating layer TI may be formed of MOF, and the dielectric constant of the MOF may be controlled to be equal to or less than half the dielectric constant of silicon dioxide.

Figure 5:
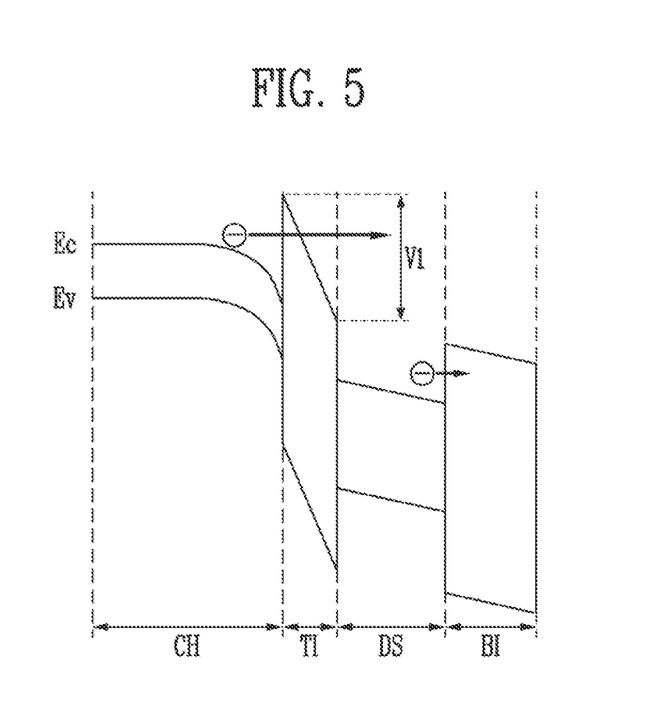
FIG. 5 is an energy band diagram for describing a program operation of a memory cell according to an embodiment of the present disclosure.

FIG. 5 is an energy band diagram for describing a program operation of a memory cell according to an embodiment of the present disclosure.

Referring to FIG. 5, an electric field may be formed in a direction from a blocking insulating layer BI to a channel area CH by a program voltage applied at the time of a program operation, and energy band bending may be caused by the electric field.

When a program voltage is applied, electric fields in a tunnel insulating layer TI, a data storage layer DS, and the blocking insulating layer BI may be affected by the dielectric constant of each of the tunnel insulating layer TI, the data storage layer DS, and the blocking insulating layer BI. Because the tunnel insulating layer TI has a lower dielectric constant than the blocking insulating layer BI, the electric field applied to the tunnel insulating layer TI may be relatively higher than that applied to the blocking insulating layer BI. Accordingly, tunneling of electrons in the blocking insulating layer BI may be reduced. Also, because tunneling of electrons in the tunnel insulating layer TI can be improved, the program speed may be improved.

According to an embodiment of the present disclosure, the tunnel insulating layer TI is formed of MOF, whereby the dielectric constant of the tunnel insulating layer TI may be formed to be equal to or less than half the dielectric constant of the blocking insulating layer BI, Further, the dielectric constant of the tunnel insulating layer TI may be lowered so as to be equal to or less than 2. Because a voltage decrease V1 in the tunnel insulating layer TI increases as the dielectric constant of the tunnel insulating layer TI is lower, tunneling of electrons in the tunnel insulating layer TI can be secured even though the electric field is decreased, whereby program operation characteristics may be secured in a low electric field.

Figure 6:
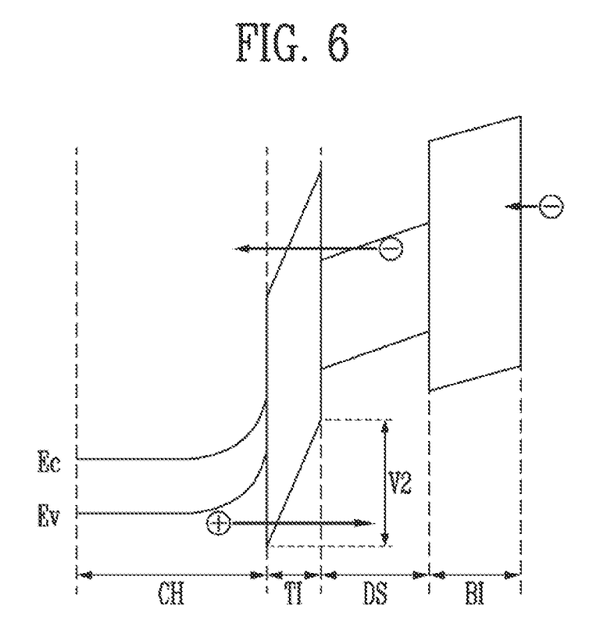
FIG. 6 is an energy band diagram for describing an erase operation of a memory cell according to an embodiment of the present disclosure.

FIG. 6 is an energy band diagram for describing an erase operation of a memory cell according to an embodiment of the present disclosure.

Referring to FIG. 6, an electric field may be formed in a direction from a channel area CH to a blocking insulating layer BI by an erase voltage applied at the time of an erase operation, and energy band bending may be caused by the electric field.

By the electric field formed by the erase voltage, the hole of the channel area CH may be injected into a data storage layer DS, and electrons may be released from the data storage layer DS into the channel area CH. Because a tunnel insulating layer TI has a lower dielectric constant than the blocking insulating layer BI, the number of electrons injected into the blocking insulating layer BI from a word line may be reduced during the erase operation, based on a principle similar to that of a program operation. Because a voltage decrease V2 in the tunnel insulating layer TI increases as the dielectric constant of the tunnel insulating layer TI is lower; even though an electric field is lowered, erase operation characteristics may be secured based on a principle similar to that of a program operation.

As described above, embodiments of the present disclosure form a tunnel insulating layer TI as MOF, whereby the dielectric constant of the tunnel insulating layer TI may be lowered to be equal to or less than half the dielectric constant of a blocking insulating layer BI. Furthermore, the dielectric constant of the tunnel insulating layer TI may be lowered to be equal to or less than 2. Accordingly, an embodiment of the present disclosure may increase the efficiency of charge tunneling in the tunnel insulating layer TI, improve the operation speed of a memory cell, and reduce charge tunneling in the blocking insulating layer BI.

Figure 7:
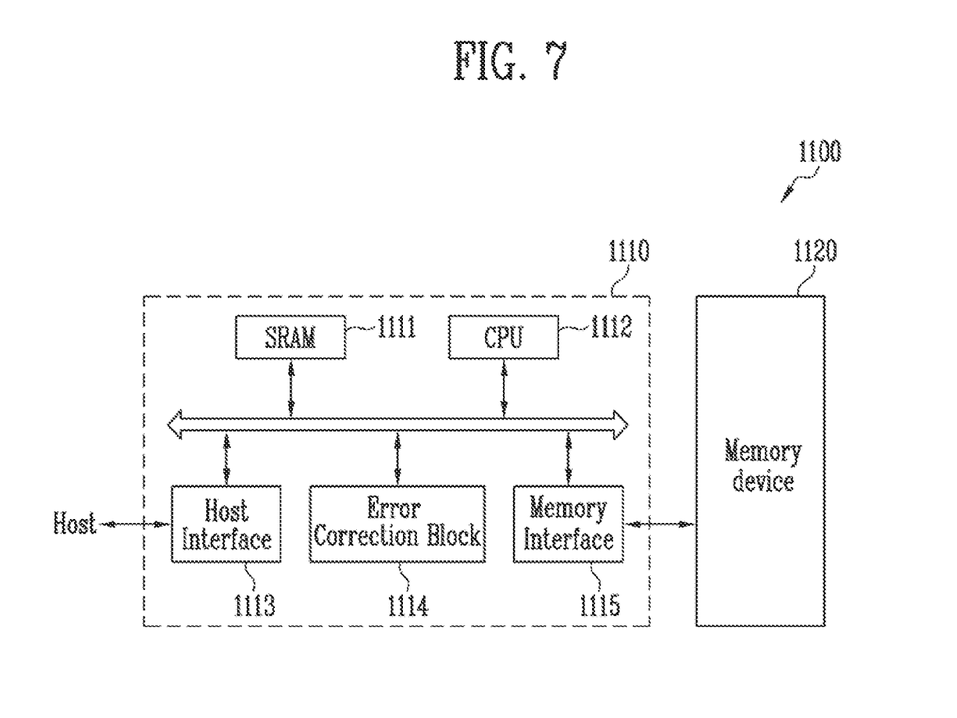
FIG. 7 is a block diagram illustrating a configuration of a memory system according to an embodiment of the present disclosure.

FIG. 7 is a block diagram illustrating the configuration of a memory system according to an embodiment of the present disclosure.

Referring to FIG. 7, a memory system 1100 includes a memory device 1120 and a memory controller 1110.

The memory device 1120 may be a multi-chip package configured with a plurality of flash memory chips. The memory device 1120 may be a 2D NAND flash memory device or a 3D NAND flash memory device. The memory device 1120 may have a memory cell including a tunnel insulating layer, a data storage layer, and a blocking insulating layer that are sequentially disposed. The tunnel insulating layer may include Metal Organic Frameworks (MOF) having a lower dielectric constant than the blocking insulating layer.

The memory controller 1110 may control the memory device 1120, and may include static random access memory (SRAM) 1111, a central processing unit (CPU) 1112, a host interface 1113, an error correction block 1114, and a memory interface 1115. The SRAM 1111 may be used as working memory of the CPU 1112, the CPU 1112 may perform overall control operations for data exchange of the memory controller 1110, and the host interface 1113 may be provided with a data interchange protocol of a host coupled to the memory system 1100. The error correction block 1114 may detect errors included in data read from the memory device 1120, and may correct the detected errors. The memory interface 1115 may interface with the memory device 1120. The memory controller 1110 may further include read only memory (ROM) or the like that stores code data for interfacing with the host.

The above-described memory system 1100 may be a memory card or a solid state drive (SSD) in which the memory device 1120 and the memory controller 1110 are combined with each other. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (DATA), a small computer system interface (SCSI), an enhanced small disk interface (ESDI), or an Integrated Drive Electronics (IDE).

Figure 8:
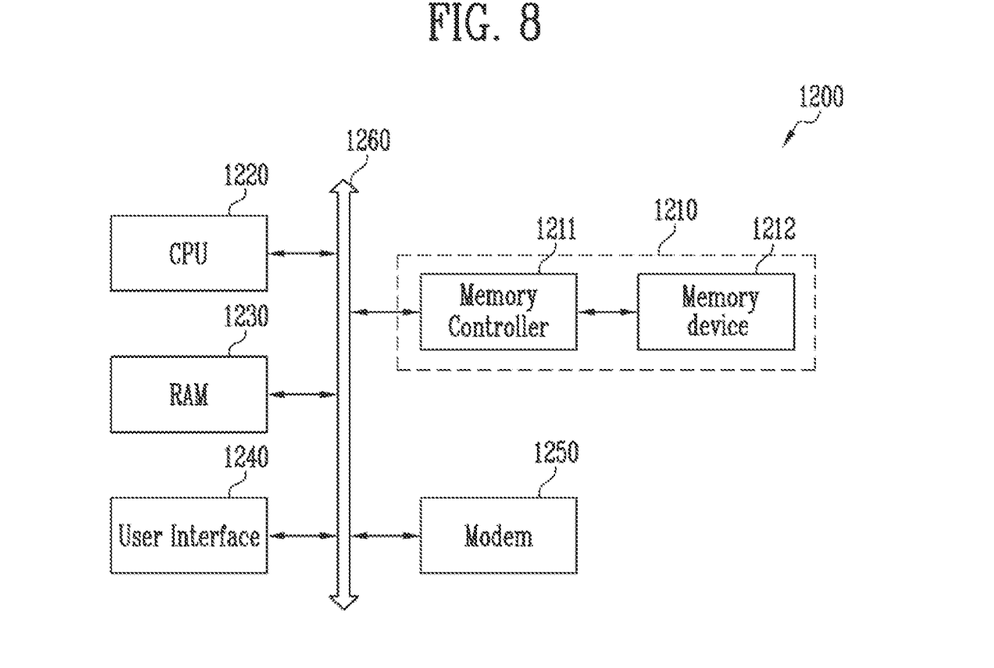
FIG. 8 is a block diagram illustrating a configuration of a computing system according to an embodiment of the present disclosure.

FIG. 8 is a block diagram illustrating the configuration of a computing system according to an embodiment of the present disclosure.

Referring to FIG. 8, a computing system 1200 may include a CPU 1220, Random Access Memory (RAM) 1230, a user interface 1240, a modem 1250, and a memory system 1210, which are electrically coupled to a system bus 1260. When the computing system 1200 is a mobile device, a battery for supplying an operation voltage to the computing system 1200 may be further included, and an application chipset, an image processor, mobile DRAM, and the like may be further included.

The memory system 1210 may be configured with a memory device 1212 and a memory controller 1211.

The memory device 1212 may be a 2D NAND flash memory device or a 3D NAND flash memory device. The memory device 1212 may have a memory cell including a tunnel insulating layer, a data storage layer, and a blocking insulating layer that are sequentially disposed. The tunnel insulating layer may include Metal Organic Frameworks (MOF) having a lower dielectric constant than the blocking insulating layer.

The present disclosure may decrease the operating voltage of a semiconductor memory device and improve the operating speed thereof through a tunnel insulating layer including Metal Organic Frameworks (MOF).

What is claimed is:

1. A semiconductor memory device, comprising:
a stacked body including interlayer insulating layers and word lines that are alternately stacked;
a hole passing through the stacked body, wherein sidewalls of the interlayer insulating layers are disposed farther from a central axis of the hole than sidewalls of the word lines to define a recess area between the word lines;
a channel layer formed in the hole;
a blocking insulating layer between each of the word lines and the channel layer;
a data storage layer between the blocking insulating layer and the channel layer; and
a tunnel insulating layer between the channel layer and the data storage layer,
wherein the tunnel insulating layer extends to fill a central portion of the recess area,
wherein the tunnel insulating layer includes Metal Organic Frameworks (MOF) having a lower dielectric constant than a dielectric constant of the blocking insulating layer.

2. The semiconductor memory device according to claim 1,
wherein the dielectric constant of the MOF is equal to or less than half the dielectric constant of the blocking insulating layer.

3. The semiconductor memory device according to claim 1,
wherein the MOF have a dielectric constant ranging from 1 to 2.

4. The semiconductor memory device according to claim 1,
wherein the blocking insulating layer includes at least one of silicon dioxide ($SiO_2$) and a dielectric material having a higher dielectric constant than a dielectric constant of the silicon dioxide.

5. The semiconductor memory device according to claim 1,
wherein each of the blocking insulating layer, the data storage layer, and the tunnel insulating layer extends into a space between each of the interlayer insulating layers and the channel layer.

6. The semiconductor memory device according to claim 1,
wherein the data storage layer includes a silicon nitride layer or silicon.

* * * * *